(12) United States Patent
Lee et al.

(10) Patent No.: US 9,159,866 B2
(45) Date of Patent: Oct. 13, 2015

(54) PHOTO SENSOR, METHOD OF MANUFACTURING PHOTO SENSOR, AND DISPLAY APPARATUS

(71) Applicants: Won-Kyu Lee, Yongin (KR); Jae-Hwan Oh, Yongin (KR); Seong-Hyun Jin, Yongin (KR); Young-Jin Chang, Yongin (KR); Jae-Beom Choi, Yongin (KR)

(72) Inventors: Won-Kyu Lee, Yongin (KR); Jae-Hwan Oh, Yongin (KR); Seong-Hyun Jin, Yongin (KR); Young-Jin Chang, Yongin (KR); Jae-Beom Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 70 days.

(21) Appl. No.: 13/916,790

(22) Filed: Jun. 13, 2013

(65) Prior Publication Data
US 2013/0280856 A1 Oct. 24, 2013

Related U.S. Application Data

(62) Division of application No. 13/137,442, filed on Aug. 16, 2011, now abandoned.

(30) Foreign Application Priority Data

Sep. 6, 2010 (KR) .................... 10-2010-0087035

(51) Int. Cl.
| | | |
|---|---|---|
| H01L 21/00 | (2006.01) | |
| H01L 31/18 | (2006.01) | |
| H01L 31/105 | (2006.01) | |
| G02F 1/133 | (2006.01) | |
| H01L 27/32 | (2006.01) | |

(52) U.S. Cl.
CPC ........ *H01L 31/1872* (2013.01); *H01L 31/1055* (2013.01); *G02F 1/13318* (2013.01); *H01L 27/3269* (2013.01); *Y02E 10/50* (2013.01)

(58) Field of Classification Search
CPC ............ H01L 31/1055; H01L 31/1872; H01L 27/3269
USPC .......................................... 438/57, 73, 96, 97
See application file for complete search history.

(56) References Cited

U.S. PATENT DOCUMENTS

| | | | | |
|---|---|---|---|---|
| 5,346,850 | A | * | 9/1994 | Kaschmitter et al. ......... 438/487 |
| 5,501,989 | A | * | 3/1996 | Takayama et al. ............. 438/155 |
| 2008/0185596 | A1 | * | 8/2008 | Tseng et al. ..................... 257/84 |
| 2009/0032823 | A1 | | 2/2009 | Im et al. |

(Continued)

FOREIGN PATENT DOCUMENTS

| | | | |
|---|---|---|---|
| KR | 10-2007-0003784 A | | 1/2007 |
| KR | 10-2008-0065535 A | | 7/2008 |

(Continued)

*Primary Examiner* — Jay C Kim
(74) *Attorney, Agent, or Firm* — Lee & Morse, P.C.

(57) ABSTRACT

A photo sensor, a method of manufacturing the photo sensor, and a display apparatus, the photo sensor including a substrate; a light receiving unit on the substrate, the light receiving unit including an amorphous semiconductor material; a first adjacent unit and a second adjacent unit formed as one body with the light receiving unit, the first adjacent unit and the second adjacent unit being separated from each other by the light receiving unit; a first photo sensor electrode electrically connected to the first adjacent unit; and a second photo sensor electrode electrically connected to the second adjacent unit, wherein at least one of the first adjacent unit and the second adjacent unit includes a crystalline semiconductor material.

5 Claims, 7 Drawing Sheets

(56) References Cited

U.S. PATENT DOCUMENTS

2010/0065851 A1* 3/2010 Makita ............................. 257/72
2011/0175086 A1   7/2011 Katoh et al.
2011/0204374 A1* 8/2011 Kimura ........................... 257/66

FOREIGN PATENT DOCUMENTS

| KR | 10-2008-0108897 A | 12/2008 |
| KR | 10-2009-0013399 A | 2/2009 |
| WO | WO 2010/035544 A1 | 4/2010 |

* cited by examiner

PHOTO SENSOR, METHOD OF MANUFACTURING PHOTO SENSOR, AND DISPLAY APPARATUS

CROSS REFERENCE TO RELATED APPLICATION

This is a divisional application based on pending application Ser. No. 13/137,442, filed Aug. 16, 2011, the entire contents of which is hereby incorporated by reference.

BACKGROUND

1. Field

Embodiments relate to a photo sensor, a method of manufacturing the photo sensor, and a display apparatus.

2. Description of the Related Art

A photo sensor may sense incident light by including a light receiving unit. Recently, photo sensors have been applied to various fields.

For example, a photo sensor may be used in a display apparatus. Recently, flat panel display apparatuses that can be easily transported and used in various external environments have attracted attention.

However, visibility of flat panel display apparatuses may vary according to intensity of external illumination.

SUMMARY

Embodiments are directed to a photo sensor, a method of manufacturing the photo sensor, and a display apparatus.

The embodiments provide a photo sensor including a substrate; a light receiving unit on the substrate, the light receiving unit including an amorphous semiconductor material; a first adjacent unit and a second adjacent unit formed as one body with the light receiving unit, the first adjacent unit and the second adjacent unit being separated from each other by the light receiving unit; a first photo sensor electrode electrically connected to the first adjacent unit; and a second photo sensor electrode electrically connected to the second adjacent unit, wherein at least one of the first adjacent unit and the second adjacent unit includes a crystalline semiconductor material.

The amorphous semiconductor material of the light receiving unit may include amorphous silicon.

A surface of the light receiving unit opposite to another surface thereof facing the substrate, a surface of the first adjacent unit opposite to another surface thereof facing the substrate, and a surface of the second adjacent unit opposite to another surface thereof facing the substrate may be coplanar.

The first adjacent unit and the second adjacent unit may include the crystalline semiconductor material, the crystalline semiconductor material including crystallized silicon, the first adjacent unit may be doped with a P-type dopant, and the second adjacent unit may be doped with an N-type dopant.

The first adjacent unit may include the crystalline semiconductor material, the crystalline semiconductor material including crystallized silicon, and the second adjacent unit may include amorphous silicon.

The first adjacent unit may be doped with a P-type dopant, and the second adjacent unit may be doped with an N-type dopant.

The first adjacent unit may be doped with an N-type dopant, and the second adjacent unit may be doped with a P-type dopant.

The embodiments also provide a method of manufacturing a photo sensor, the method including forming a light receiving unit, a first adjacent unit, and a second adjacent unit on a substrate, such that the light receiving unit includes an amorphous semiconductor material, the first and second adjacent units are formed as one body with the light receiving unit and the first and second adjacent units are separated from each other by the light receiving unit; and forming a first photo sensor electrode and a second photo sensor electrode such that the first photo sensor electrode is electrically connected to the first adjacent unit and the second photo sensor electrode is electrically connected to the second adjacent unit, wherein at least one of the first adjacent unit and the second adjacent unit includes a crystalline semiconductor material.

Forming the light receiving unit, the first adjacent unit, and the second adjacent unit may include forming an amorphous semiconductor material layer on the substrate; and selectively crystallizing a region of the amorphous semiconductor material layer, the region corresponding to at least one of the first adjacent unit and the second adjacent unit.

The method may further include performing a single patterning process on the amorphous semiconductor material layer to form the light receiving unit, the first adjacent unit, and the second adjacent unit after selectively crystallizing the region of the amorphous semiconductor material layer.

The amorphous semiconductor material of the light receiving unit may include amorphous silicon.

A surface of the light receiving unit opposite to another surface thereof facing the substrate, a surface of the first adjacent unit opposite to another surface thereof facing the substrate, and a surface of the second adjacent unit opposite to another surface thereof facing the substrate may be coplanar.

The first adjacent unit and the second adjacent unit may include the crystalline semiconductor material, the crystalline semiconductor material including crystallized silicon, the first adjacent unit may be doped with a P-type dopant, and the second adjacent unit may be doped with an N-type dopant.

The amorphous semiconductor material of the light receiving unit may include silicon, and forming the light receiving unit, the first adjacent unit, and the second adjacent unit may include forming an amorphous semiconductor material layer on the substrate; and selectively crystallizing a region of the amorphous semiconductor material layer corresponding to the first adjacent unit.

The first adjacent unit may be doped with a P-type dopant, and the second adjacent unit may be doped with an N-type dopant.

The first adjacent unit may be doped with an N-type dopant, and the second adjacent unit may be doped with a P-type dopant.

The embodiments also provide a display apparatus including a substrate; a display device; a light receiving unit on the substrate, the light receiving unit including an amorphous semiconductor material; a first adjacent unit and a second adjacent unit formed as one body with the light receiving unit, the first adjacent unit and the second adjacent unit being separated from each other by the light receiving unit; and a first photo sensor electrode electrically connected to the first adjacent unit; and a second photo sensor electrode electrically connected to the second adjacent unit, wherein at least one of the first adjacent unit and the second adjacent unit includes a crystalline semiconductor material.

The display device may be all organic light emitting display device or a liquid crystal display device.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION OF THE INVENTION

Figure 1:
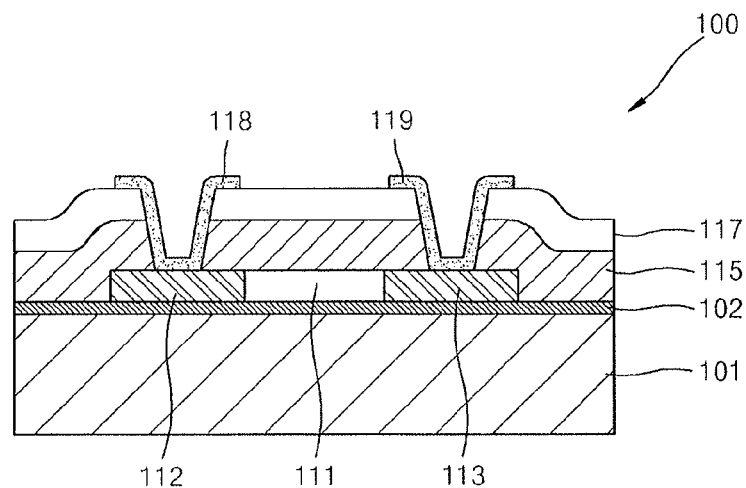
FIG. 1 illustrates a schematic cross-sectional view of a photo sensor according to an embodiment.

Korean Patent Application No. 10-2010-0087035, filed on Sep. 6, 2010, in the Korean Intellectual Property Office, and entitled: "Photo Sensor, Method of Manufacturing Photo Sensor, and Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic cross-sectional view of a photo sensor according to an embodiment.

Referring to FIG. 1, the photo sensor 100 may include a substrate 101, a light receiving unit 111, a first adjacent unit 112, a second adjacent unit 113, a first insulating layer 115, a second insulating layer 117, a first photo sensor electrode 118, and a second photo sensor electrode 119.

The substrate 101 may be formed of, e.g., a glass material having $SiO_2$ as a main component. However, the substrate 101 is not limited thereto, and may be formed of, e.g., a plastic material. If the substrate 101 is formed of a plastic material, the plastic material may include an organic material including at least one of, e.g., polyethersulphone (PES), polyacrylate (PAR), polyetherimide (PEI), polyethyelenen napthalate (PEN), polyethyelenetereptahalate (PET), polyphenylene sulfide (PPS), polyallylate, polyimide, polycarbonate (PC), cellulose triacetate (TAC), and cellulose acetate propionate (CAP). In an implementation, the substrate 101 may include, e.g., a thin metal film.

A buffer layer 102 may be formed on the substrate 101. The buffer layer 102 may provide a flat surface on the substrate 101 and may prevent moisture and foreign material from penetrating into the substrate 101.

The light receiving unit 111, the first adjacent unit 112, and the second adjacent unit 113 may be formed on the buffer layer 102. For example, the light receiving unit 111, the first adjacent unit 112, and the second adjacent unit 113 may be formed as one body.

The light receiving unit 111 may be formed of an amorphous semiconductor material, which may sensitively react with external light. Accordingly, the photo sensor 100 may precisely sense light. In an implementation, the amorphous semiconductor material may include, e.g., amorphous silicon.

The first adjacent unit 112 and the second adjacent unit 113 may be formed of a crystalline semiconductor material. In an implementation, the crystalline semiconductor material may include, e.g., crystalline silicon.

As described above, the light receiving unit 111, the first adjacent unit 112, and the second adjacent unit 113 may be formed as one body. Thus, a side surface of the light receiving unit 111 and a side surface of the first adjacent unit 112 may be perfectly or seamlessly connected to each other without any defects or foreign materials therebetween. Also, a side surface of the light receiving unit 111 and a side surface of the second adjacent unit 113 may be perfectly or seamlessly connected to each other without any defects or foreign materials therebetween. Accordingly, optical sensing efficiency and electrical characteristics of the photo sensor 100 may be increased.

Of the surfaces of the light receiving unit 111, an upper surface of the light receiving unit 111, e.g., a surface opposite to a surface of the light receiving unit 111 that contacts the substrate 101, may be at a same level as, i.e., coplanar with, upper surfaces of the first adjacent unit 112 and the second adjacent unit 113. Therefore, the first insulating layer 115 may tightly and effectively contact the light receiving unit 111, the first adjacent unit 112, and the second adjacent unit 113. Also, step coverage characteristics of the first insulating layer 115 and the second insulating layer 117 may be increased.

The first adjacent unit 112 and the second adjacent unit 113 may be doped with a P-type dopant and an N-type dopant, respectively. However, the embodiments are not limited thereto; and the first adjacent unit 112 and/or the second adjacent unit 113 may not be doped.

The first insulating layer 115 may be formed on the light receiving unit 111, the first adjacent unit 112, and the second adjacent unit 113. The second insulating layer 117 may be formed on the first insulating layer 115.

The first photo sensor electrode 118 and the second photo sensor electrode 119 may be formed on the second insulating layer 117. For example, the first photo sensor electrode 118 may be connected to a region of the first adjacent unit 112 not covered by, but rather exposed by, the first insulating layer 115 and the second insulating layer 117. The second photo sensor electrode 119 may be connected to a region of the second adjacent unit 113 not covered by, but rather exposed by, the first insulating layer 115 and the second insulating layer 117.

The first photo sensor electrode 118 and the second photo sensor electrode 119 may be formed of a metal, e.g., Au, Pd, Pt, Ni, Rh, Ru, Ir, Os, Al, or Mo, or an alloy of these metals, but are not limited thereto.

Although not illustrated, a passivation film for covering the first photo sensor electrode 118 and the second photo sensor electrode 119 may further be formed.

An operation of the photo sensor 100 will now be briefly described.

When voltages different from each other, e.g., a positive and a negative voltage, are respectively applied to the first photo sensor electrode 118 and the second photo sensor electrode 119 and light is incident on the light receiving unit 111, electrons and holes may be generated in the light receiving unit 111 in response to the incident light. The electrons and holes generated in the light receiving unit 111 may move to the first photo sensor electrode 118 and the second photo sensor electrode 119, and as a result, a current may flow in a direction. By detecting existence and intensity of incident light may be sensed by using the photo sensor 100.

The photo sensor 100 according to an embodiment may have a precise optical sensing characteristic. For example, the light receiving unit 111 of the photo sensor 100 may include amorphous silicon, which may sensitively react to light.

As described above, in the photo sensor 100, the light receiving unit 111, the first adjacent unit 112, and the second adjacent unit 113 may be formed as one body. Thus, an impact may not separate the light receiving unit 111, the first adjacent unit 112, and the second adjacent unit 113; and the photo sensor 100 may exhibit increased durability. In addition, a manufacturing process may be simplified, thereby increasing process convenience.

In addition, contact between the light receiving unit 111 and the first and second adjacent units 112 and 113, respectively, may be increased. Thus, the electrical characteristics of the photo sensor 100 may be increased.

As described above, the upper surface of the light receiving unit 111 and the upper surfaces of the first and second adjacent units 112 and 113 may be coplanar. Thus, a bonding force between the first insulating layer 115 and the light receiving unit 111, the first adjacent unit 112, and the second adjacent unit 113 may be increased and the step coverage characteristics of the first insulating layer 115 and the second insulating layer 117 may be increased.

In addition, the light receiving unit 111, the first adjacent unit 112, and the second adjacent unit 113 may be formed on the same plane. Thus, a thickness of the photo sensor 100 may be advantageously reduced.

FIGS. 2A through 2F illustrate schematic drawings of stages in a method of manufacturing the photo sensor of FIG. 1.

Figure 2A:
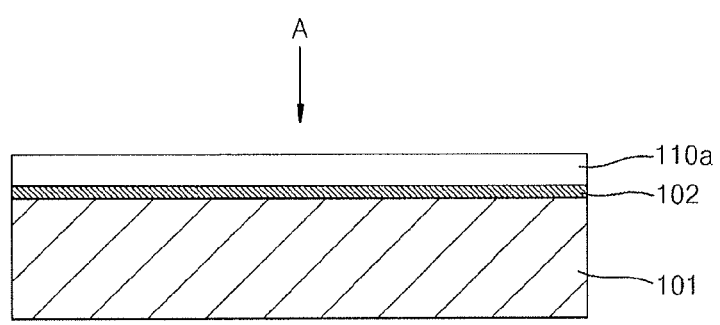
FIGS. 2A through 2F illustrate schematic drawings of stages in a method of manufacturing the photo sensor of FIG. 1.
Figure 2B:
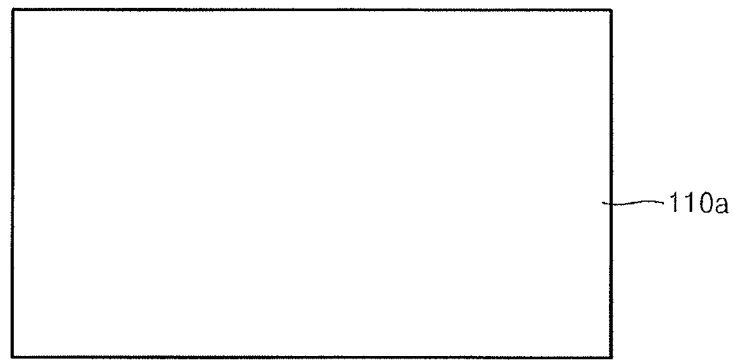

Referring to FIGS. 2A and 2B, the buffer layer 102 and a semiconductor material layer 110a may be formed on the substrate 101. FIG. 2B illustrates a plan view of FIG. 2A viewed from a direction A. The buffer layer 102 and the semiconductor material layer 110a may be unpatterned. The semiconductor material layer 110a may include various semiconductor materials, e.g., silicon. For example, the semiconductor material layer 110a may include amorphous silicon.

Figure 2C:
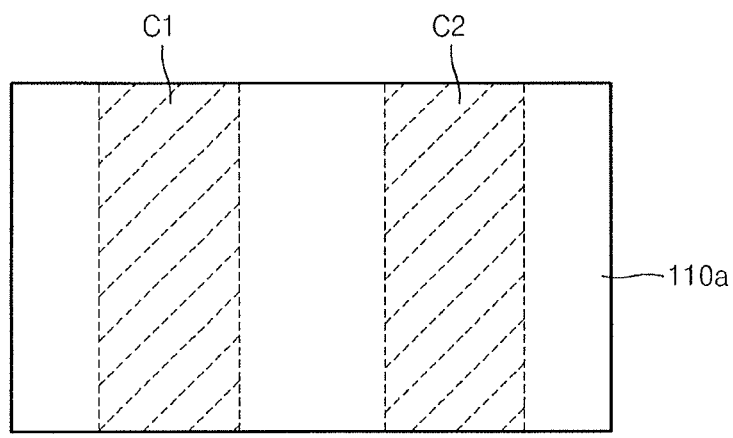

Referring to FIG. 2C, a crystallization process may be performed. For example, the crystallization process may be selectively performed with respect to or on regions C1 and C2 of the semiconductor material layer 110a. The crystallization process may be performed by using various methods, e.g., by using a laser. For example, the crystallization process may be selectively performed with respect to the regions C1 and C2 of the semiconductor material layer 110a by using a mask.

As illustrated FIG. 2C, the regions C1 and C2 may include regions for forming the first adjacent unit 112 and the second adjacent unit 113, respectively, in a subsequent process. Also, a region of the semiconductor material layer 110a between the C1 and C2 regions may include a region where the crystallization process is not performed and where the light receiving unit 111 is to be formed in a subsequent process.

Figure 2D:
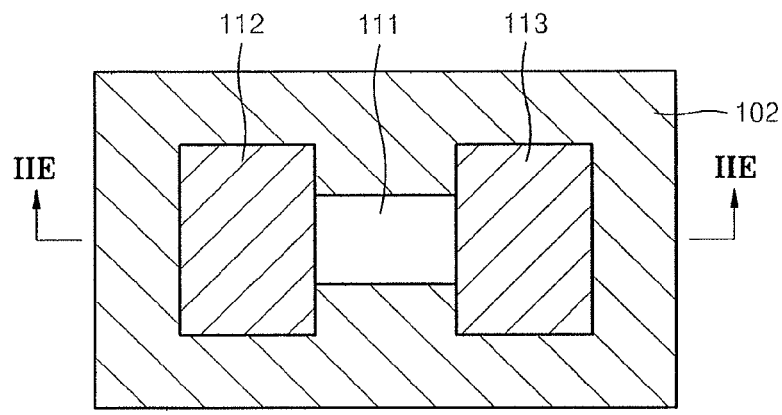
Figure 2E:
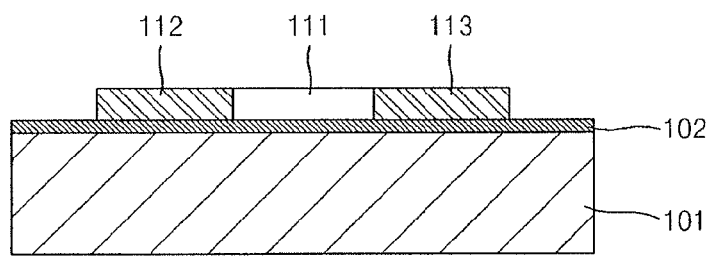

Referring to FIGS. 2D and 2E, after performing the crystallization process, the light receiving unit 111, the first adjacent unit 112, and the second adjacent unit 113 may be formed by performing a patterning process, e.g., a photolithography process. FIG. 2E illustrates a cross-sectional view taken along a line IIE-IIE of FIG. 2D. For example, the light receiving unit 111 may include amorphous silicon; and the first adjacent unit 112 and the second adjacent unit 113 may include crystalline silicon.

Since the light receiving unit 111, the first adjacent unit 112, and the second adjacent unit 113 may be formed by performing a single photolithography process, process convenience for manufacturing the photo sensor 100 may be increased. Also, through the reduced manufacturing process, defects may be less likely to be generated in a process of patterning the light receiving unit 111, the first adjacent unit 112, and the second adjacent unit 113.

Although not shown, the first adjacent unit 112 and the second adjacent unit 113 may be doped with a P-type dopant and an N-type dopant, respectively. The doping process may be performed in various operation steps; e.g., the doping process may be performed after the crystallization process illustrated in FIG. 2C.

However, the embodiments are not limited thereto; and the first adjacent unit 112 and the second adjacent unit 113 may not be doped.

Figure 2F:
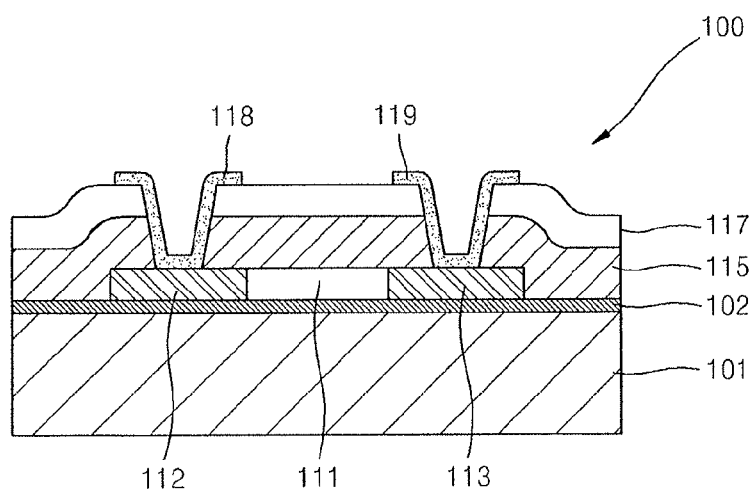

Referring to FIG. 2F, the first insulating layer 115 and the second insulating layer 117 may be formed on the light receiving unit 111, the first adjacent unit 112, and the second adjacent unit 113. The first photo sensor electrode 118 and the second photo sensor electrode 119 may be formed on the second insulating layer 117. Thus, the manufacturing of the photo sensor 100 may be finally complete.

As described above, the upper surface of the light receiving unit 111 and upper surfaces of the first adjacent unit 112 and the second adjacent unit 113 may be coplanar. Thus, bonding force between the first insulating layer 115 and the light receiving unit 111, the first adjacent unit 112, and the second adjacent unit 113 may be increased. Also, the step coverage characteristics of the first insulating layer 115 and the second insulating layer 117 may be increased.

Although not illustrated, the passivation film for covering the first photo sensor electrode 118 and the second photo sensor electrode 119 may further be formed.

In the present embodiment, a selective crystallization process may be performed with respect to the first adjacent unit 112 and the second adjacent unit 113; and the light receiving unit 111 may be formed of amorphous silicon. Accordingly, the photo sensor 100 may precisely sense light.

In the present embodiment, as described above, the light receiving unit 111, the first adjacent unit 112, and the second adjacent unit 113 may be formed as one body. Thus, the side surface of the light receiving unit 111 and the side surface of the first adjacent unit 112 may be perfectly or seamlessly connected to each other without any defects or foreign materials therebetween. In addition, the side surface of the light receiving unit 111 and the side surface of the second adjacent unit 113 may be perfectly or seamlessly connected to each other without any defects or foreign materials therebetween. Accordingly, the optical sensing efficiency and the electrical characteristics of the photo sensor 100 may be advantageously increased.

Also, in the present embodiment, when the photo sensor 100 is manufactured, the light receiving unit 111, the first adjacent unit 112, and the second adjacent unit 113 may be formed as one body by using or from the semiconductor material layer 110a. Therefore, the process of manufacturing the light receiving unit 111, the first adjacent unit 112, and the second adjacent unit 113 may be simplified, thereby beneficially reducing process time and defects in the manufacturing process.

Also, contact characteristics between the light receiving unit 111 and the first adjacent unit 112 and between the light receiving unit 111 and the second adjacent unit 113 may be increased, thereby increasing the electrical characteristics of the photo sensor 100.

Figure 3:
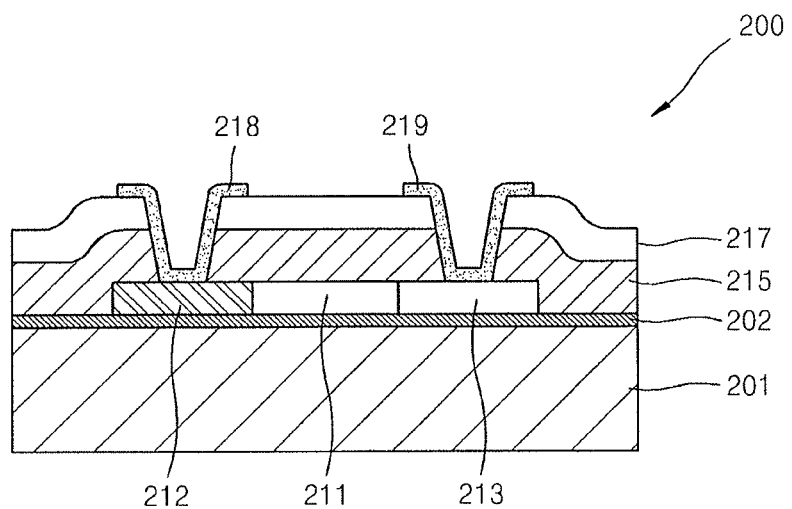
FIG. 3 illustrates a schematic cross-sectional view of a photo sensor according to another embodiment.

FIG. 3 illustrates a schematic cross-sectional view of a photo sensor according to another embodiment. For convenience of explanation, mainly differences between the photo sensor 100 of the previous embodiment and the photo sensor 200 of the present embodiment will be described. Thus, a repeated description of the same elements is omitted.

Referring to FIG. 3, the photo sensor 200 according to the present embodiment of may include a substrate 201, a light receiving unit 211, a first adjacent unit 212, a second adjacent unit 213, a first insulating layer 215, a second insulating layer 217, a first photo sensor electrode 218, and a second photo sensor electrode 219.

The photo sensor 200 will now be described more in detail. A buffer layer 202 may be formed on the substrate 201. The light receiving unit 211, the first adjacent unit 212, and the second adjacent unit 213 may be formed on the buffer layer 202. For example, the light receiving unit 211, the first adjacent unit 212, and the second adjacent unit 213 may be formed as one body.

The light receiving unit 211 may be formed of an amorphous semiconductor material, which may sensitively react with external light. Therefore, the photo sensor 200 may precisely sense light. In an implementation, the amorphous semiconductor material may include, e.g., amorphous silicon.

The first adjacent unit 212 may include a crystalline semiconductor material and the second adjacent unit 213 may include an amorphous semiconductor material. In an implementation, the crystalline semiconductor material may include, e.g., crystalline silicon; and the amorphous semiconductor material may include, e.g., amorphous silicon.

As described above, the light receiving unit 211, the first adjacent unit 212, and the second adjacent unit 213 may be formed as one body. Thus, a side surface of the light receiving unit 211 and a side surface of the first adjacent unit 212 may be perfectly or seamlessly connected without any defects or foreign materials therebetween. In addition, a side surface of the light receiving unit 211 and a side surface of the second adjacent unit 213 may be perfectly or seamlessly connected without any defects or foreign materials therebetween. Therefore, optical sensing efficiency and electrical characteristics of the photo sensor 200 may be increased.

Of the surfaces of the light receiving unit 211, an upper surface of the light receiving unit 211, e.g., a surface thereof opposite to a surface that contacts the substrate 201, and upper surfaces of the first and second adjacent units 212 and 213 may be coplanar. Therefore, a first insulating layer 215 may tightly or closely contact the light receiving unit 211, the first adjacent unit 212, and the second adjacent unit 213. Also, step coverage characteristics of a first insulating layer 215 and a second insulating layer 217 may be increased.

The first adjacent unit 212 and the second adjacent unit 213 may be doped with a P-type dopant and an N-type dopant, respectively. For example, the first adjacent unit 212 may be doped with a P-type dopant; and the second adjacent unit 213 may be doped with an N-type dopant. However, the embodiments are not limited thereto; and the first adjacent unit 212 may be doped with an N-type dopant, and the second adjacent unit 213 may be doped with a P-type dopant. In an implementation, the first adjacent unit 212 and the second adjacent unit 213 may not be doped.

The first insulating layer 215 and the second insulating layer 217 may be formed on the light receiving unit 211, the first adjacent unit 212, and the second adjacent unit 213.

The first photo sensor electrode 218 and the second photo sensor electrode 219 may be formed on the second insulating layer 217. For example, the first photo sensor electrode 218 may be connected to a region of the first adjacent unit 212 not covered by, but rather exposed by, the first insulating layer 215 and the second insulating layer 217. The second photo sensor electrode 219 may be connected to a region of the second adjacent unit 213 not covered by, but rather exposed by, the first insulating layer 215 and the second insulating layer 217.

Although not illustrated, a passivation film for covering the first photo sensor electrode 218 and the second photo sensor electrode 219 may further be formed.

In the present embodiment, as described above, the light receiving unit 211 may include amorphous silicon. Thus, the photo sensor 200 may have a precise optical sensing characteristic by sensitively reacting to light.

Also, as described above, in the photo sensor 200, the light receiving unit 211, the first adjacent unit 212, and the second adjacent unit 213 may be formed as one body. Thus, an impact may not separate the light receiving unit 211, the first adjacent unit 212, and the second adjacent unit 213 from each other, and the photo sensor 200 may exhibit increased durability. Also, a manufacturing process may be simplified, thereby increasing process convenience.

Also, contact characteristics between the light receiving unit 211 and the first and second adjacent units 212 and 213, respectively, may be increased. Thus, the electrical characteristics of the photo sensor 200 may be increased.

As described above, an upper surface of the light receiving unit 211 and upper surfaces of the first and second adjacent units 212 and 213 may be coplanar. Thus, a bonding force between the first insulating layer 215 and the light receiving unit 211, the first adjacent unit 212, and the second adjacent unit 213 as well as the step coverage characteristics of the first insulating layer 215 and the second insulating layer 217 may be increased.

Also, the light receiving unit 211, the first adjacent unit 212, and the second adjacent unit 213 may be formed on the same plane. Thus, a thickness of the photo sensor 200 may be advantageously reduced.

FIGS. 4A through 4F illustrate schematic views of stages in a method of manufacturing a photo sensor of FIG. 3.

Figure 4A:
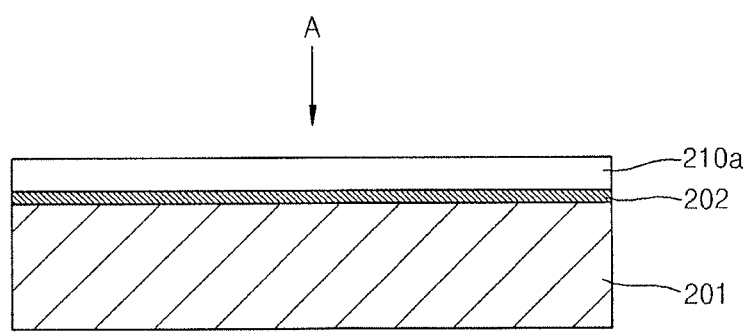
FIGS. 4A through 4F illustrate schematic cross-sectional views of stages in a method of manufacturing the photo sensor of FIG. 3.
Figure 4B:
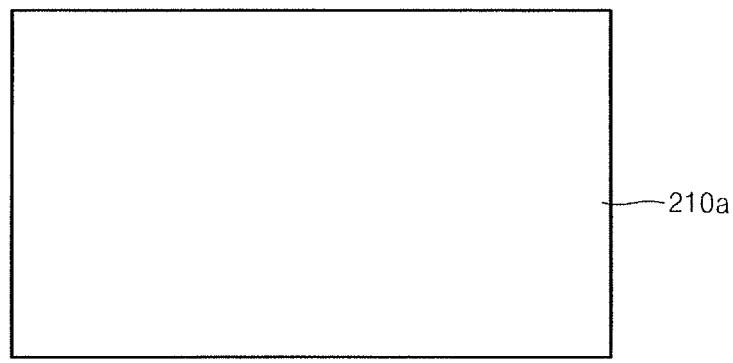

Referring to FIGS. 4A and 4B, the buffer layer 202 and a semiconductor material layer 210a may be formed on the substrate 201. FIG. 4B illustrates a plan view of FIG. 4A viewed from a direction A. The buffer layer 202 and the semiconductor material layer 210a may not have additional patterns. The semiconductor material layer 210a may include various semiconductor materials, e.g., silicon. For example, the semiconductor material layer 210a may include amorphous silicon.

Figure 4C:
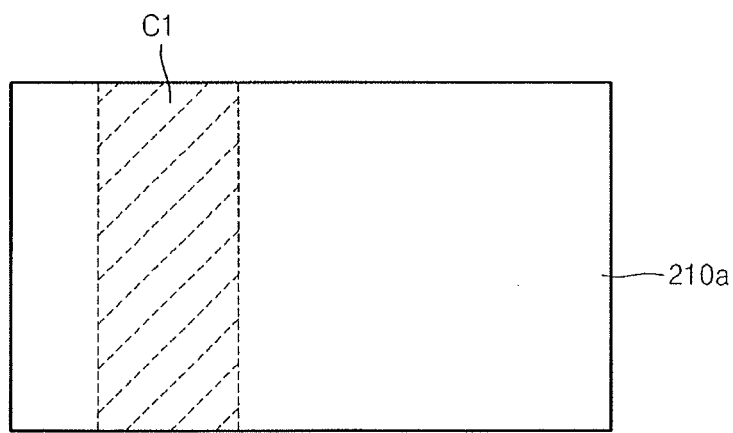

Referring to FIG. 4C, a crystallization process may be performed. For example, the crystallization process may be selectively performed with respect to or on a region C1 of the semiconductor material layer 210a. The crystallization process may be performed by using various methods, e.g., by using a laser. For example, the crystallization process may be selectively performed with respect to the region C1 of the semiconductor material layer 210a by using a mask.

In FIG. 4C, the region C1 may include a region for forming the first adjacent unit 212 in a subsequent process. Also, a region of the semiconductor material layer 210a that is adjacent to the region C1 may be an amorphous state since no crystallization process may be performed thereon and may include a region for forming the light receiving unit 211 in a subsequent process. Also, a region of the semiconductor material layer 210a that is separated from the region C1 may include an amorphous state since no crystallization process may be performed thereon and may include a region for forming the second light receiving unit 211 in a subsequent process.

Figure 4D:
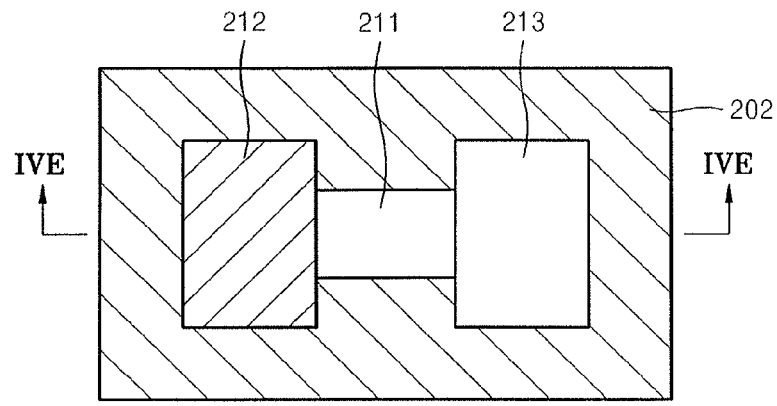
Figure 4E:
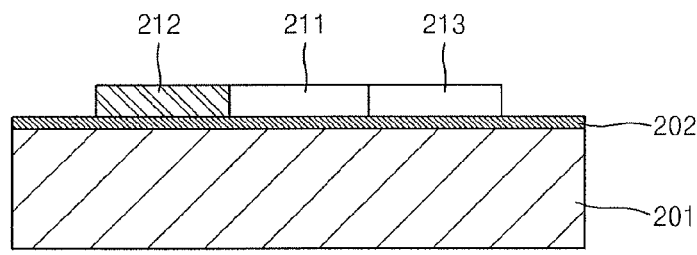

Referring to FIGS. 4D and 4E, after performing the crystallization process, the light receiving unit 211, the first adjacent unit 212, and the second adjacent unit 213 may be formed by performing a patterning process, e.g., a photolithography process. FIG. 4E illustrates a cross-sectional view taken along a line IVE-IVE of FIG. 4D. For example, the light receiving unit 211 and the second adjacent unit 213 may include an amorphous semiconductor material, e.g., amorphous silicon; and the first adjacent unit 212 may include a crystalline semiconductor material, e.g., crystalline silicon.

As described above, the light receiving unit 211, the first adjacent unit 212, and the second adjacent unit 213 may be formed by performing a single photolithography process. Thus, process convenience for manufacturing the photo sensor 200 may be increased. Also, through the reduced manufacturing process, defects may be less likely to be generated in a process of patterning the light receiving unit 111, the first adjacent unit 112, and the second adjacent unit 113.

Although not illustrated, the first adjacent unit 212 and the second adjacent unit 213 may be doped with a P-type dopant and an N-type dopant, respectively. However, the embodiments are not limited thereto; and the first adjacent unit 212 may be doped with an N-type dopant, and the second adjacent unit 213 may be doped with a P-type dopant.

In an implementation, the doping process may be performed in various operation steps; e.g., the doping process may be performed after the crystallization process depicted in FIG. 4C.

Also, in an implementation, the first adjacent unit 212 and the second adjacent unit 213 may not be doped.

Figure 4F:
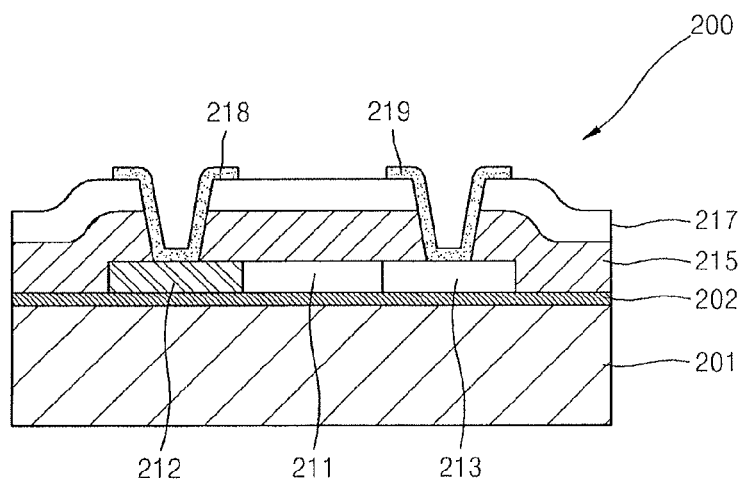

Referring to FIG. 4F, the first insulating layer 215 and the second insulating layer 217 may be formed on the light receiving unit 211, the first adjacent unit 212, and the second adjacent unit 213. The first photo sensor electrode 218 and the second photo sensor electrode 219 may be formed on the second insulating layer 217. Thus, the manufacturing of the photo sensor 200 may be finally complete.

As described above, the upper surface of the light receiving unit 211 and upper surfaces of the first adjacent unit 212 and the second adjacent unit 213 may be coplanar. Thus, bonding force between the first insulating layer 215 and the light receiving unit 211, the first adjacent unit 212, and the second adjacent unit 213 may be increased. Also, the step coverage characteristics of the first insulating layer 215 and the second insulating layer 217 may be increased.

Although not shown, a passivation film for covering the first photo sensor electrode 218 and the second photo sensor electrode 219 may further be formed.

In the present embodiment, a selective crystallization process may be performed with respect to the first adjacent unit 212; and the light receiving unit 211 may be formed of amorphous silicon. Therefore, the photo sensor 200 may precisely sense light.

In the present embodiment, the light receiving unit 211, the first adjacent unit 212, and the second adjacent unit 213 may be formed as one body. Thus, a side surface of the light receiving unit 211 and a side surface of the first adjacent unit 212 may be perfectly or seamlessly connected to each other without any defects or foreign materials therebetween. In addition, a side surface of the light receiving unit 211 and a side surface of the second adjacent unit 213 may be perfectly or seamlessly connected to each other without any defects or foreign materials therebetween. Therefore, optical sensing efficiency and electrical characteristics of the photo sensor 200 may be increased.

Also, in the present embodiment, during manufacturing of the photo sensor 200, the light receiving unit 211, the first adjacent unit 212, and the second adjacent unit 213 may be formed as one body structure using the semiconductor material layer 210a. Therefore, the process of manufacturing the light receiving unit 211, the first adjacent unit 212, and the second adjacent unit 213 may be simplified, thereby reducing process time and defects in the manufacturing process.

Also, contact characteristics between the light receiving unit 211 and the first adjacent unit 212 and between the light receiving unit 211 and the second adjacent unit 213 may be increased, thereby increasing the electrical characteristics of the photo sensor 200.

Figure 5:
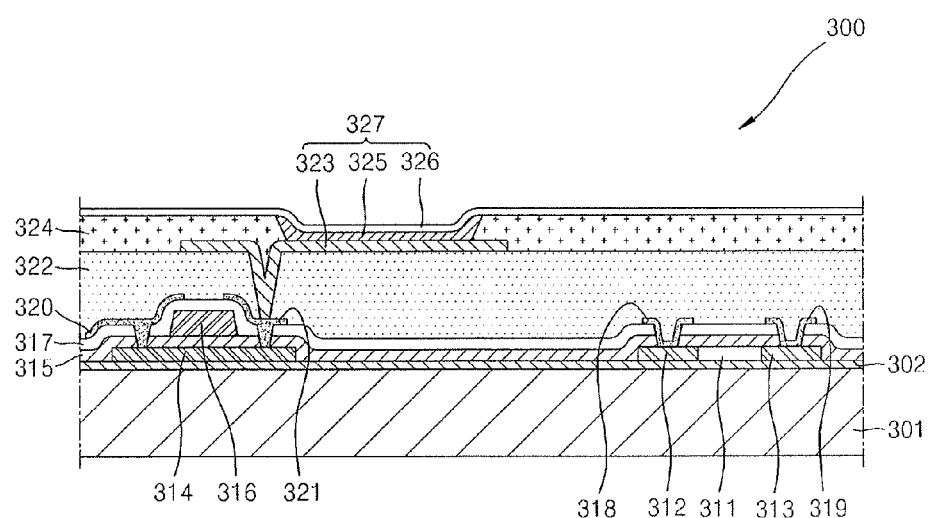
FIG. 5 illustrates a schematic cross-sectional view of a display apparatus according to an embodiment.

FIG. 5 illustrates a schematic cross-sectional view of a display apparatus according to an embodiment.

The display apparatus 300 according to the present embodiment may include an organic light emitting display apparatus having an organic light emitting device 327, but is not limited thereto. In an implementation, the display apparatus 300 according to the present embodiment may include different display apparatuses, e.g., a liquid crystal display apparatus.

The display apparatus 300 will now be described in detail with reference to FIG. 5.

A buffer layer 302 may be formed on a substrate 301. An active layer 314 having a predetermined pattern may be formed on the buffer layer 302. The active layer 314 may be formed of an inorganic semiconductor or an organic semiconductor, e.g., amorphous silicon or polysilicon, and may include a source region, a drain region, and a channel region. The source region and the drain region may be formed by doping a dopant into which the active layer 314 formed of amorphous silicon or polysilicon. A P-type semiconductor may be formed when the active layer 314 is doped with boron B, which is a Group III element, and an N-type semiconductor may be formed when the active layer 314 is doped with nitrogen N, which is a Group V element.

A light receiving unit 311, a first adjacent unit 312, and a second adjacent unit 313 may be formed separate from the active layer 314 on the buffer layer 302. For example, the light receiving unit 311, the first adjacent unit 312, and the second adjacent unit 313 may be formed as one body. The light receiving unit 311 may be formed of an amorphous semiconductor material, e.g., amorphous silicon. Configurations of the light receiving unit 311, the first adjacent unit 312, and the second adjacent unit 313 according to the present embodiment are substantially identical to those of the previous embodiments. Thus, repeated detailed descriptions thereof are omitted.

In an implementation, the first adjacent unit 312 and the second adjacent unit 313 may be selectively crystallized by a single crystallization process when the active layer 314 is formed. In another implementation, only the first adjacent unit 312 may be selectively crystallized when the active layer 314 is formed.

A gate insulating film 315 may be formed on the active layer 314, the light receiving unit 311, the first adjacent unit 312, and the second adjacent unit 313. A gate electrode 316 may be formed on a predetermined region of the gate insulating film 315.

The gate electrode 316 may be formed of a metal, e.g., Au, Ag, Cu, Ni, Pt, Pd, Al, and/or Mo, and/or a metal alloy such as Al:Nd or Mo:W. However, the embodiments are not limited thereto, and the gate electrode 316 may be formed of various materials in consideration of, e.g., tightness, planarity, electrical resistance, process ability, etc. The gate electrode 316 may be connected to a gate line (not illustrated) that applies an electrical signal.

An interlayer insulating film 317 may be formed on the gate electrode 316. The interlayer insulating film 317 and the gate insulating film 315 may expose the source and drain regions of the active layer 314 so that a source electrode 320 and a drain electrode 321 may be connected to the exposed regions of the active layer 314.

Also, the interlayer insulating film 317 and the gate insulating film 315 may expose a predetermined region of the first adjacent unit 312 and a predetermined region of the second adjacent unit 313. A first photo sensor electrode 318 may be connected to the exposed region of the first adjacent unit 312; and a second photo sensor electrode 319 may be connected to the exposed region of the second adjacent unit 313.

The source electrode 320 and the drain electrode 321 may be formed of the same material used to form the first photo sensor electrode 318 and the second photo sensor electrode 319.

A passivation layer 322 for covering the source electrode 320, the drain electrode 321, the first photo sensor electrode 318, and the second photo sensor electrode 319 may be formed. The passivation layer 322 may be formed using, e.g., an inorganic insulating film, an organic insulating film, or a composite stack layer of an inorganic insulating film and an organic insulating film.

The passivation layer 322 may expose the drain electrode 321; and an organic light emitting device 327 may be electrically connected to the drain electrode 321. The organic light emitting device 327 may include a pixel electrode 323, a facing electrode 326, and an intermediate layer 325. For example, the pixel electrode 323 may contact the drain electrode 321.

For example, a pixel defining layer 324 may be formed on the pixel electrode 323 using an insulating material. The pixel electrode 323 may be exposed by forming a predetermined opening in the pixel defining layer 324. The intermediate layer 325 may be formed on the exposed pixel electrode 323. Afterwards, the facing electrode 326 may be formed to be connected to the intermediate layer 325.

The intermediate layer 325 may include an organic light emitting layer and may emit visible light when a voltage is applied to the pixel electrode 323 and the facing electrode 326.

The pixel electrode 323 and the facing electrode 326 may be an anode electrode and a cathode electrode, respectively. In an implementation, the polarity of the pixel electrode 323 and the facing electrode 326 may be reversed.

Although not shown, a sealing member may further be formed on the facing electrode 326.

The display apparatus 300 according to the present embodiment may readily sense light by including the light receiving unit 311, the first adjacent unit 312, the second adjacent unit 313, the first photo sensor electrode 318, and the second photo sensor electrode 319. Accordingly, brightness of visible light emitted from the organic light emitting device 327 may be readily controlled according to intensity of illumination of external light.

By way of summation and review, if a photo sensor is included in a flat panel display apparatus, the photo sensor may sense light incident from outside the apparatus. According to a result of sensing intensity of illumination of external light, brightness of light emitted from a plurality of pixel units that realize an image of the flat panel display apparatus may be controlled, thereby optimizing visibility of the image. In this regard, the embodiments may overcome a limit in improving characteristics, e.g., optical sensing efficiency and a manufacturing process of a photo sensor.

The embodiments provide to a photo sensor having increased electrical characteristics and optical sensing characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a photo sensor, the method comprising:
    forming a light receiving unit, a first adjacent unit, and a second adjacent unit on a substrate, such that:
        the light receiving unit includes an amorphous semiconductor material,
        the first and second adjacent units are formed as one body with the light receiving unit and the first and second adjacent units are separated from each other by the light receiving unit; and
    forming a first photo sensor electrode and a second photo sensor electrode such that the first photo sensor electrode is electrically connected to the first adjacent unit and the second photo sensor electrode is electrically connected to the second adjacent unit,
    wherein:
    the first adjacent unit includes a crystalline semiconductor material and the second adjacent unit includes an amorphous semiconductor material,
    the amorphous semiconductor material of the light receiving unit includes silicon, and
    forming the light receiving unit, the first adjacent unit, and the second adjacent unit includes:
        forming an amorphous semiconductor material layer on the substrate; and
        selectively crystallizing a region of the amorphous semiconductor material layer corresponding to the first adjacent unit.

2. The method as claimed in claim 1, further comprising performing a single patterning process on the amorphous semiconductor material layer to form the light receiving unit, the first adjacent unit, and the second adjacent unit after selectively crystallizing the region of the amorphous semiconductor material layer.

3. The method as claimed in claim 1, wherein a surface of the light receiving unit opposite to another surface thereof facing the substrate, a surface of the first adjacent unit opposite to another surface thereof facing the substrate, and a surface of the second adjacent unit opposite to another surface thereof facing the substrate are coplanar.

4. The method as claimed in claim 1, wherein:
    the first adjacent unit is doped with a P-type dopant, and
    the second adjacent unit is doped with an N-type dopant.

5. The method as claimed in claim 1, wherein:
    the first adjacent unit is doped with an N-type dopant, and
    the second adjacent unit is doped with a P-type dopant.

* * * * *